United States Patent [19]
Takahashi

[11] Patent Number: 6,072,374
[45] Date of Patent: Jun. 6, 2000

[54] FM MODULATION SYSTEM USING QUADRATURE MODULATOR

[75] Inventor: Masayuki Takahashi, Tokyo, Japan

[73] Assignee: Ando Electric Co., Ltd., Tokyo, Japan

[21] Appl. No.: 09/136,469

[22] Filed: Aug. 19, 1998

[30] Foreign Application Priority Data

Aug. 29, 1997 [JP] Japan ................................. 9-249728

[51] Int. Cl.[7] .............................. H03C 3/00; H04L 27/32
[52] U.S. Cl. ..................... 332/117; 332/117; 332/103; 455/102; 455/110; 455/553; 375/216
[58] Field of Search .................................. 455/553, 102, 455/110, 574; 332/117, 119, 103; 375/216, 239, 298, 308

[56] References Cited

U.S. PATENT DOCUMENTS 4,540,958 9/1985 Neyens et al. .
5,111,163 5/1992 Erlich ................................. 332/117
5,787,362 7/1998 Matero ................................ 455/553

*Primary Examiner*—Arnold Kinkead
*Attorney, Agent, or Firm*—Flynn, Thiel, Boutell & Tanis, P.C.

[57] ABSTRACT

The invention provides a FM modulation system using a quadrature modulator, wherein a circuit for exclusive use in FM modulation and a change-over means can be dispensed with. In this system, modulating signals are inputted to a baseband signal processing circuit, converted into digital signals after integration, and turned into an analog signal by reading out a sine wave signal pre-stored in a sin ROM, thereby generating a baseband signal I for an equi-phase signal and a baseband signal Q for a quadrature signal. By adding together results of multiplication of the baseband signal I for the equi-phase signal and the baseband signal Q for the quadrature signal by a local signal of cosine and a sine wave signal obtained by phase shifting the local signal through 90 degrees, respectively, a quadrature modulation signal containing a FM modulated signal and the maximum frequency deviation can be generated.

2 Claims, 4 Drawing Sheets

FM MODULATION SYSTEM USING QUADRATURE MODULATOR

BACKGROUND OF THE INVENTION

1. Field of the Invention

The invention relates to a FM modulation system using a quadrature modulator, and particularly, to a FM modulation system using a quadrature modulator, wherein a FM modulator and a system for taking out an output signal therefrom can be dispensed with through processing of a baseband signal and subsequent operation of quadrature modulation thereof in coping with a dual mode communications system incorporating a FM (frequency modulation) method in combination with CDMA (code division multiple access) techniques.

2. Description of the Related Art

The CDMA techniques used by conventional communications servers in Japan always incorporate both analog TACS (total access communication system) and a CDMA method, and since respective modulation methods differ from each other, the TACS adopts a FM modulation while the CDMA method adopts quadrature modulation.

FIG. 4 is a block diagram showing the construction of a conventional dual mode communications system incorporating both the TACS and CDMA method.

As shown in FIG. 4, in the TACS adopting frequency modulation, a modulating signal fm is inputted to a FM modulator 1 for frequency modulation, and subsequently, after converting frequency through multiplication thereof by a local signal LA at a multiplier (mixer) 2, a modulated wave is taken out by switching a change-over device 3.

Meanwhile, in the CDMA method, a baseband signal ba and the local signal LA are inputted to a quadrature modulator 4 for quadrature modulation, and a modulated wave is taken out by switching the change-over device 3.

Thus, with the conventional dual mode communications system incorporating both the TACS and CDMA method, the TACS employs the FM modulator 1 wherein an output signal from an oscillator (not shown) is frequency modulated in a frequency band in the range of about 40 to 50 MHz by the modulating signal fm such as an audio signal, and further converted to the order of 800 MHz in frequency by the multiplier (mixer) 2.

Accordingly, the oscillator is a must for the FM modulator 1, and has a frequency band in the range of about 40 to 50 MHz. Since the output signal from the oscillator which is frequency modulated in the frequency band in the range of about 40 to 50 MHz by the modulating signal fm, always has side bands generated at the sides thereof, and is further converted to the order of 800 MHz in frequency after multiplication by the local signal LA at the multiplier 2, removal of the side bands is called for.

For removal of the side bands, however, a filter having a characteristic of sharp frequency cut will be called for, but it is technically very difficult and very high in cost to manufacture such a filter having the characteristic of sharp frequency cut.

Although it is also conceivable as an alternative to lower the oscillation frequency of the local signal, this will entail necessity of increasing the oscillation frequency of the FM modulator, and as it is difficult to manufacture a FM modulator at high frequency, an increase in cost will result.

SUMMARY OF THE INVENTION

The invention has been developed to solve aforesaid problems encountered with conventional systems, and an object of the invention is to provide a FM modulation system using a quadrature modulator, capable of taking out a FM modulated signal from a quadrature modulator so that a conventional FM modulator and a system for taking out the FM modulated signal can be dispensed with, attaining simplification in a circuit scale and reduction in cost.

To this end, the FM modulation system using the quadrature modulator according to the invention comprises a baseband processing circuit for generating a baseband signal for a quadrature signal and a baseband signal for an equi-phase signal by reading out a pre-stored sine wave signal of a predetermined frequency and converting the same into an analog signal with the use of an address signal obtained by digitizing a modulating signal input through a predetermined sampling process, and the quadrature modulator for generating a FM modulated high frequency signal by adding together a signal obtained through multiplication of the baseband signal for the equi-phase signal by a local signal of a cosine signal at respective predetermined frequencies, and a signal obtained through multiplication of a sine signal resulting from phase-shifting the local signal through 90° by the baseband signal for the quadrature signal.

DESCRIPTION OF THE PREFERRED EMBODIMENTS

Figure 1:
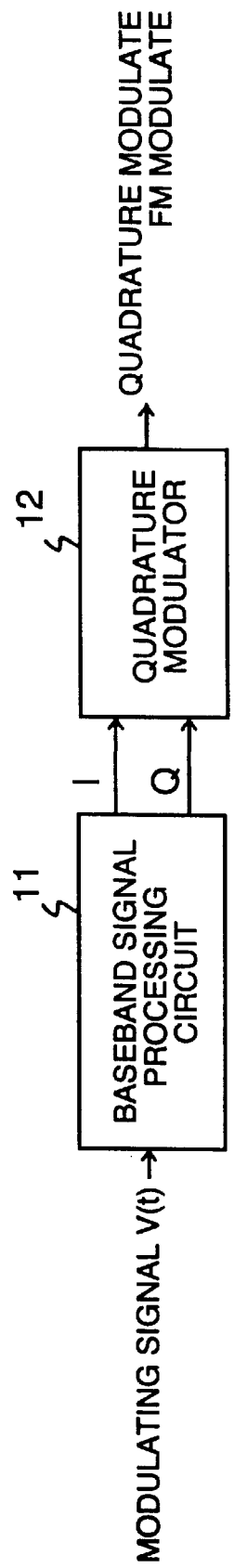
FIG. 1 is a block schematic diagram showing the construction of a first embodiment of a FM modulation system using a quadrature modulator according to the invention.

Embodiments of a FM modulation system using a quadrature modulator according to the invention is described hereinafter with reference to the accompanying drawings. FIG. 1 is a block diagram showing the construction of a first embodiment of the invention.

In FIG. 1, the FM modulation system according to the first embodiment comprises a baseband signal processing circuit 11 for receiving a modulating signal V (t) for executing a predetermined processing, thereby outputting a baseband signal I for a quadrature modulated equi-phase signal and baseband signal Q for a quadrature signal, and a quadrature modulator 12 for receiving the baseband signal I for the equi-phase signal and the baseband signal Q for the quadrature signal which are multiplied with a local signal fc of a cosine (abbreviated "cos") wave signal and a sine (abbreviated "sin") wave signal produced by phase-shifting the local signal fc through 90°, respectively, thereby outputting the quadrature modulated equi-phase signal and the quadrature signal.

Figure 2:
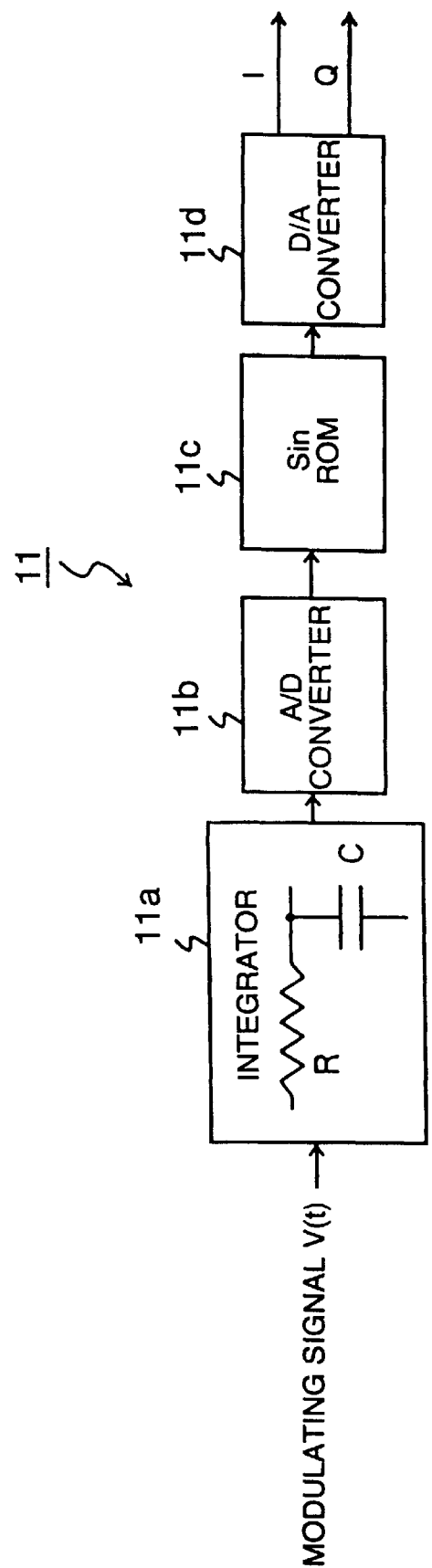
FIG. 2 is a block schematic diagram showing the internal structure of a baseband signal processing circuit of the FM modulation system using the quadrature modulator shown in FIG. 1.

FIG. 2 is a block diagram showing the internal structure of the baseband signal processing circuit 11 of the FM modulation system according to the first embodiment of the invention.

In FIG. 2, by inputting modulating signals V (t)=VO cos $2\pi$ fm t to an integrating circuit 11a, the modulating signals V (t) are integrated, and an integrated output signal Vc (t) at the output terminal of the integrating circuit 11a is represented by the following formula (1);

$$Vc(t)=VO/\sqrt{1+(2\pi\, fm\, CR)2}\cdot\cos(2\pi\, fm\, CRt+\psi-\pi/2) \quad (1)$$

where $\psi=\tan-1\,(1/2\pi\, fm\, CR)$ and C represents capacitance and R represents resistance.

The modulating signals V (t) are integrated in the integrating circuit 11a because a signal outputted from a sin ROM 11c as memory means described later is sin {VO cos $(2\pi\, fm\, t)$} where fm denotes a modulation frequency.

The integrated output signal Vc (t) produced by integrating the modulating signals V (t) in the integrating circuit 11a is delivered to an analog-digital (referred to hereinafter as A/D) converter 11b.

If with respect to Vc (t) in the formula (1) above, $2\pi\, fm\, CR$ is large enough to be able to ignore "1", (t) can be represented by the following equation;

$$(t)=(VO/2\pi\, fm\, CR)\cdot\sin 2\pi\, fm=(VO/2\pi\, fm\, CR)\cdot\sin(2\pi\, fm\, t)=[\{(1/2\pi\, CR)\cdot VO\}/fm]\cdot\sin(2\pi\, fm\, t) \quad (2)$$

The integrated output signal Vc (t) is sent out to the A/D converter 11b where the integrated output signal Vc (t) is converted into a digital signal through sampling with a sampling signal fs.

An output signal from the A/D converter 11b, that is, the digital signal converted as described is inputted to a sin ROM 11c as an address signal for reading out data written in the sin ROM 11c as the memory means.

To obtain the address signal, A/D conversion data D of the A/D converter 11b is found in the following manner.

The A/D conversion data D of the A/D converter 11b at time t is found by the following formula (3);

$$\{Vc(t)/VREF\}=D/(2n-1) \quad (3)$$

where VREF is the full scale of the A/D converter 11b, and n is the number of bits.

From the formula (3), the following is obtained;

$$D=\{Vc(t)/VREF\}\cdot(2n-1) \quad (4)$$

Using the A/D conversion data D according to the formula (4) as address data in the sin ROM 11c, and assuming the full scale VREF of the A/D converter 11b as $(2n-1)=2\pi$, sin data written in the sin ROM 11c is read out, and converted into an analog signal by a digital-analog converter (referred to hereinafter as D/A converter 11d), thereby finding the baseband signal I for the quadrature modulated equi-phase signal by the following formula (5);

$$I=\cos\{(mf\cdot V/fm)\cdot\sin(2\pi\, fm\cdot t)\} \quad (5)$$

Then, the quadrature modulated baseband signal Q for the quadrature signal is found by the following formula (6);

$$Q=\sin\{(mf\cdot V/fm)\cdot\sin(2\pi\, fm\cdot t)\} \quad (6)$$

The baseband signal I for the equi-phase signal and the baseband signal Q for the quadrature signal, thus produced, are outputted from the D/A converter 11d in FIG. 2, and inputted to the quadrature modulator 12, for quadrature modulation after multiplication by the local signal fc, thereby producing a quadrature modulated signal.

Figure 3:
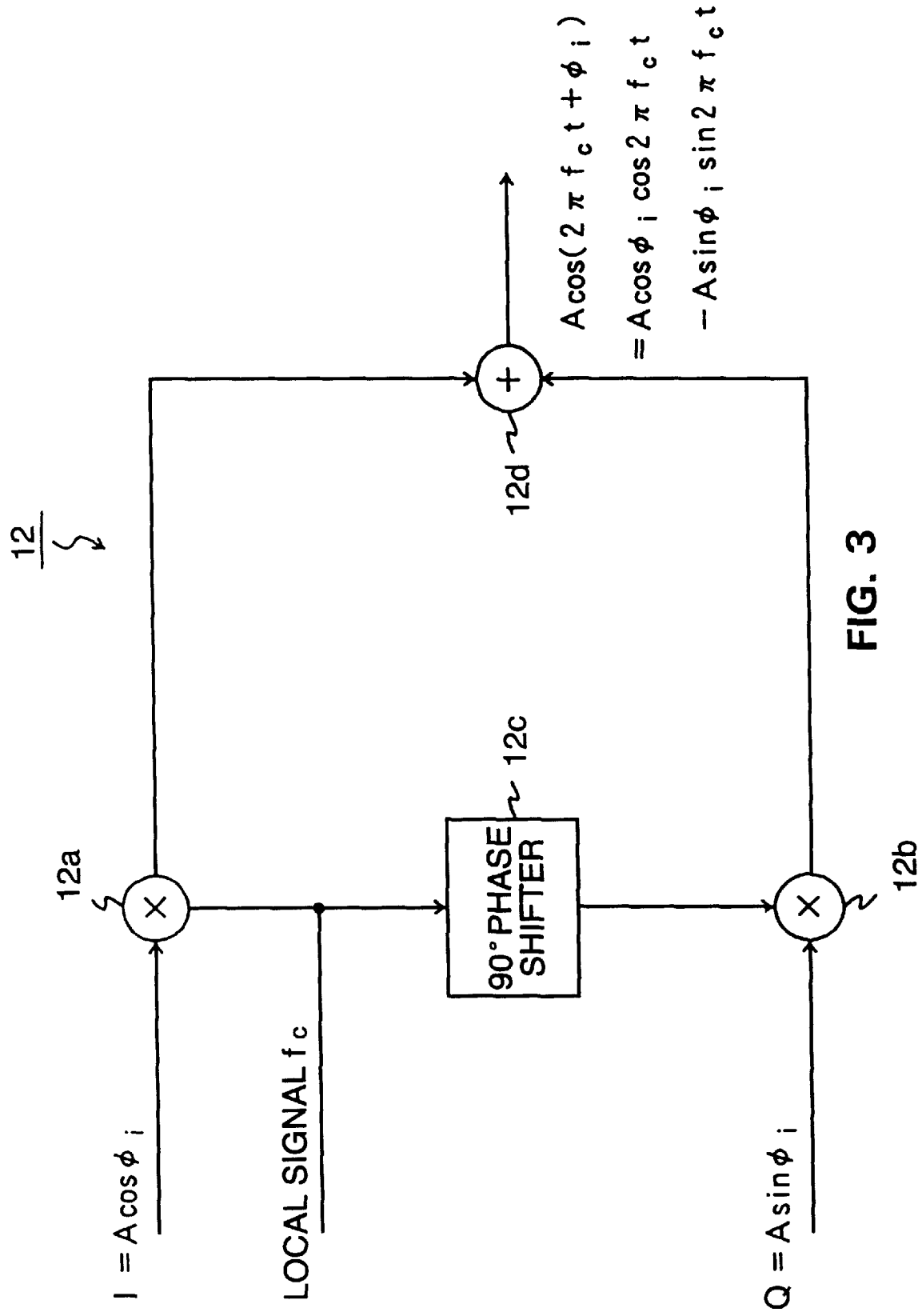
FIG. 3 is a block schematic diagram showing the internal structure of the quadrature modulator of the FM modulation system using the quadrature modulator shown in FIG. 1.
Figure 4:
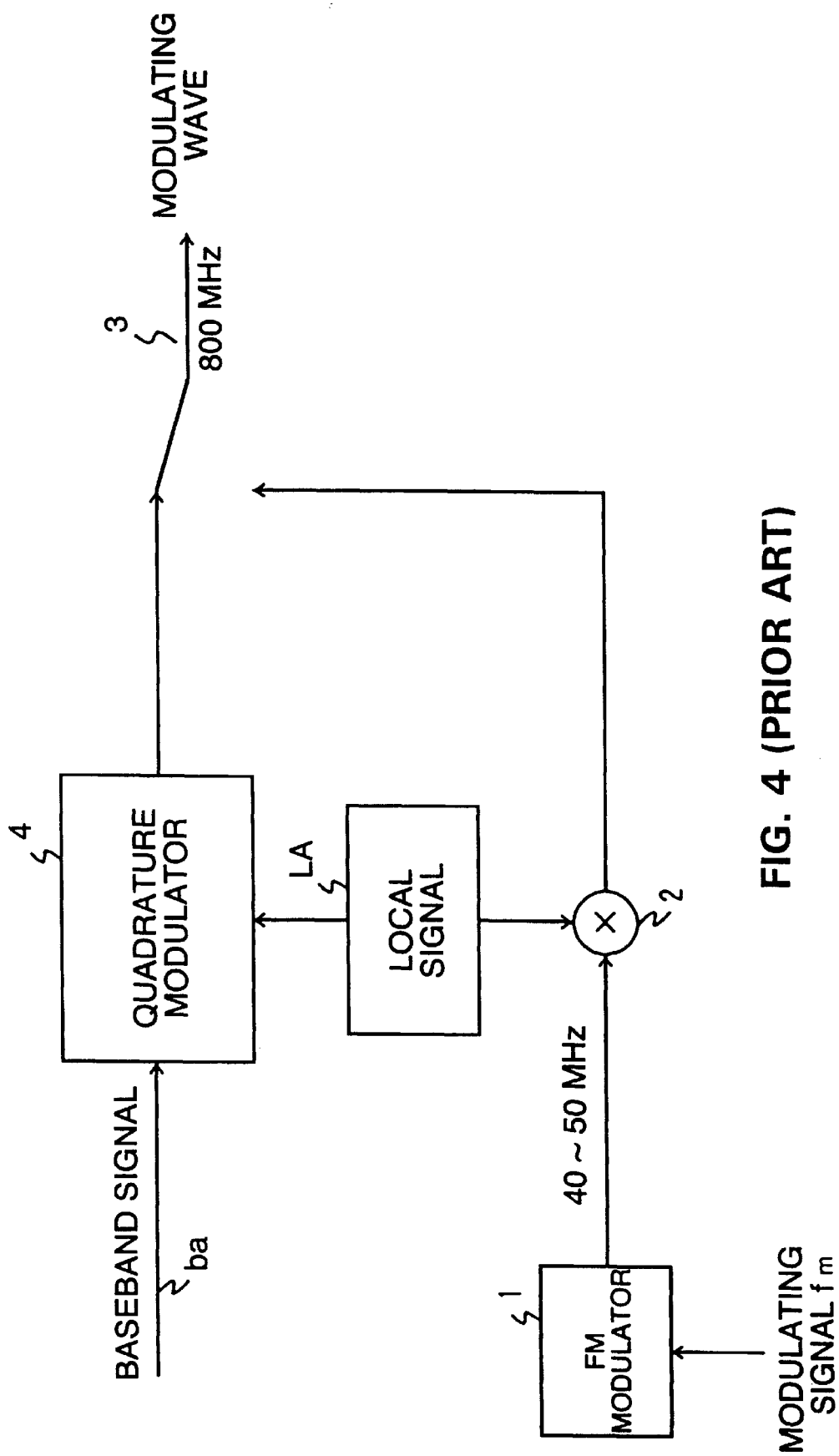
FIG. 4 is a block schematic diagram showing the construction of a conventional dual mode communications system incorporating TACS in combination with a CDMA method.

FIG. 3 shows the internal structure of the quadrature modulator 12. In FIG. 3, the baseband signal I for the equi-phase signal (for brevity, expressed as I=A cos $\phi$ i in FIG. 3) and the baseband signal Q for the quadrature signal (also for brevity, expressed as Q=A sin $\phi$ i in FIG. 3) are inputted to a first input terminal of first and second multipliers (mixers) 12a, and 12b, respectively, and the local signal fc {cos $(2\pi\, fc\, t)$} is inputted to the second input terminal of the first multiplier 12a.

The local signal fc is also inputted to a 90° phase shifter 12c. The local signal fc with the phase thereof shifted by 90°, after inputted to the 90° phase shifter 12c, is inputted as $-\sin(2\pi\, fc\, t)$ to the second input terminal of the second multiplier 12b.

The first multiplier 12a executes multiplication of the local signal fc {cos $(2\pi\, fc\, t)$} by the baseband signal I for the equi-phase signal, and outputs a multiplication result to the first input terminal of an adder 12d.

The second multiplier 12b execute multiplication of the baseband signal Q for the quadrature signal by the local signal fc whose phase is shifted by 90°, {$-\sin(2\pi\, fc\, t)$}, and outputs a multiplication result to the second input terminal of the adder 12d.

The adder 12d adds together output signals from the respective multipliers 12a, 12b, and outputs the quadrature modulated signal Emod as expressed by the following formula (7);

$$Emod=A\cos(2\pi\, fc\, t+\phi i)=A\cos\phi i\cdot\cos 2\pi\, fc\, t-A\sin\phi\, i\cdot\cos 2\pi\, fc\, t \quad (7)$$

A cos $\phi$ i according to the formula (7) represents the baseband signal I for the equi-phase signal inputted to the quadrature modulator 12, and A sin $\phi$ i represents the baseband signal Q for the quadrature signal.

In the FM modulation system using the quadrature modulator according to the invention, a FM modulated signal must be included in the quadrature modulated signal Emod in order to dispense with a conventional FM modulator.

Accordingly, the quadrature modulated signal Emod is compared hereinafter with a phase modulating signal EPM and a frequency modulating signal EFM, respectively, on the basis of a modulating wave E=cos $\phi$ (t) where $\phi$ (t)= instantaneous phase, assuming:

an instantaneous phase of the quadrature modulated signal Emod $$\phi(t)=2\pi\, fc\, t+\phi i \quad (8),$$

an instantaneous phase of the phase modulating signal EPM $$\phi(t)=2\pi\, fc\, t+2\pi\cdot mPV(t) \quad (9),$$

an instantaneous phase of the frequency modulating signal EFM $$\phi(t)=2\pi\, fe\, t+2\pi\cdot mf\int V(t)dt \quad (10),$$

and a phase angle in the formula (8)$\phi$ i=$-\pi\sim+\pi$. Also, mP in the formula (9) denotes a coefficient, and V (t) a modulating signal. Further, mf in the formula (10) denotes a coefficient, and $2\pi$ is employed to find a phase by the radian.

Now, if a modulating frequency f=fm, and the modulating signal V (t)=V cos $(2\pi\, fm\, t)$, the following formula (11) results;

the phase modulating signal EPM=cos {$2\pi\, fc\, t+2\pi\cdot mP\, V\cos(2\pi\, fm\, t)$} (11)

By employing the modulation index $\beta=2\pi \cdot mPV$, the formula (11) can be expressed as follows;

$$\text{EPM}=\cos\{2\pi \text{ fc } t+\beta \cos 2\pi \text{ fm } t)\} \quad (12).$$

Then, on the basis of $\int V(t)dt=(V/2\pi \text{ fm}) \sin (2\pi \text{ fm t})$, the frequency modulating signal EFM can be expressed as follows;

$$\text{EFM}=\cos\{2\pi \text{ fc } t+2\pi \text{ mf}(V/2\pi \text{ fm}) \sin (2\pi \text{ fm } t)\}=\cos\{2\pi \text{ fc } t+(\text{mf V/fm}) \sin (2\pi \text{ fm } t)\} \quad (13).$$

The formula (13) above indicates that the instantaneous phase $\phi(t)$ of the FM modulating wave can be represented by (mf V/fm) sin ($2\pi$ fm t).

And, an instantaneous frequency f of the FM modulating wave can be represented by the following formula;

$$(d/dt)\phi(t)=2\pi\{fc+mf \text{ V} \cos (2\pi \text{ fm } t)\} \quad (14).$$

In the formula (14) above, mf V represents the maximum frequency deviation $\Delta f$, and the formula (14) is replaced by the following formula (15), employing the maximum frequency deviation $\Delta f$;

$$\text{EFM}=\cos\{2\pi \text{ fc } t+(\Delta f/\text{fm})\cdot\sin (2\pi \text{ fm } t)\} \quad (15).$$

In comparing the FM modulating wave in the formula (15) with a phase modulating wave in the formula (12), the following relation exists among the modulation index $\beta$ in the formula (12), maximum frequency deviation $\Delta f$ and modulating frequency fm in the formula (15);

$$\beta=\Delta f/\text{fm}.$$

As is evident from the foregoing, factors inside braces in the formula (12) above correspond to the instantaneous phase $\phi(t)$ of the phase modulating wave, and factors inside braces in the formula (15) above correspond to the instantaneous phase $\phi(t)$ of the frequency modulating wave.

Accordingly, the quadrature modulated signal Emod=A cos ($2\pi$ fc t +$\phi$i) produced by inputting the baseband signal I for the equi-phase signal I=A cos $\phi$i and the baseband signal Q for the quadrature signal Q=A sin $\phi$i to the quadrature modulator 12 for quadrature modulation is essentially phase modulated, and $\phi$i in the formula is a quadrature modulated signal.

For frequency modulation, as EFM=cos $\{2\pi$ fc t+$\Sigma\phi$i dt$\}$, $\phi$i in the formula is replaced by the factors within braces in the formula (15) above as follows;

$$\phi i=(\Delta f/\text{fm})\cdot\sin (2\pi \text{ fm } t) \quad (16).$$

Thus, a FM wave as desired can be produced by the quadrature modulated signal Emod=A cos ($2\pi$ fc t+$\phi$i).

By substituting the formula (16) above for $\phi$i in the baseband signal I for the equi-phase signal=A cos $\phi$i, and the baseband signal Q for the quadrature signal=A sin $\phi$i, respectively, the following formulae result;

$$I=A \cos\{(\Delta f/\text{fm})\cdot\sin (2\pi \text{ fm } t)\} \quad (17)$$

$$Q=A \sin\{(\Delta f/\text{fm})\cdot\sin (2\pi \text{ fm } t)\} \quad (18)$$

When the baseband signal I for the equi-phase signal=A cos $\phi$i, and the baseband signal Q for the quadrature signal=A sin $\phi$i, according to the formula (17) and the formula (18), respectively, are inputted to the quadrature modulator 12 for quadrature modulation, a FM wave of the modulation frequency fm and the maximum frequency deviation $\Delta f$ is outputted from the quadrature modulator 12.

Consequently, in a system incorporating the FM process combined with the quadrature modulation process such as the CDMA method, a circuit for exclusive use for frequency modulation can be dispensed with.

In the first embodiment of the invention described hereinbefore, the baseband signal processing circuit 11 may not be limited to an example shown in FIG. 2, but in place of the A/D converter 11a shown in FIG. 2, a clock counter may be used so that an address signal is outputted to the sin ROM according to the number of counts by a clock signal, data read out from the sin ROM is converted to analog by the D/A converter 11d, and subsequently, integrated in an integrating circuit, producing the baseband signal I for the equi-phase signal and the baseband signal Q for the quadrature signal.

In the description given above on the construction of the baseband signal processing circuit 11, mention is made of a hardware aspect only, however, the baseband signal I for the equi-phase signal and the baseband signal Q for the quadrature signal may be calculated by a software instead.

As described, with the FM modulation system using the quadrature modulator according to the invention, a modulating signal is inputted to the baseband signal processing circuit so that data of a sin table, pre-stored in the memory means, is read out by the digitized address signal, and converted to analog, producing the baseband signal I for the equi-phase signal and the baseband signal Q for the quadrature signal for quadrature modulation by the quadrature modulator. As a result, the quadrature modulated signal generated by the quadrature modulator can contain a frequency modulated signal.

Hence, in a system with the FM process and quadrature modulation process such as the CDMA method in mixed presence, the circuit for exclusive use for frequency modulation can be dispensed with, and such components as an oscillator required in a FM modulator, a filter technically difficult to manufacture, and a change-over device for switching between the FM and quadrature modulation processes will no longer be required, contributing to reduction in cost.

What is claimed is:

1. An FM modulation system comprising:

a baseband signal processing circuit for generating a baseband signal for a quadrature signal and a baseband signal for an equi-phase signal by reading out a sine wave signal of a predetermined frequency pre-stored and converting the same into an analog signal with the use of an address signal obtained by digitizing modulating signals input through a predetermined sampling process; and a quadrature modulator for generating a FM modulated high frequency signal by adding together a signal obtained through multiplication of the baseband signal for the equi-phase signal by a local signal of a cosine signal at respective predetermined frequencies, and a signal obtained through multiplication of a sine signal resulting from phase-shifting the local signal through 90 degrees by the baseband signal for the quadrature signal; and said baseband signal processing circuit including:

(a) memory means for pre-storing the sine wave signal of the predetermined frequency, (b) a counter for generating the address signal which reads out the sine wave signal stored in the memory means by use of a clock signal, (c) a digital-to-analog converter for converting data from the memory means corresponding to the sine wave signal into an analog signal, and (d) an integrator for generating the baseband signal for the equi-phase signal and the baseband signal for the quadrature signal by integrating output signals of the digital-to-analog converter.

2. An FM modulation system comprising:

a baseband signal processing circuit for generating a baseband signal for a quadrature signal and a baseband signal for an equi-phase signal by reading out a sine wave signal of a predetermined frequency pre-stored and converting the same into an analog signal with the use of an address signal obtained by digitizing modulating signals input through a predetermined sampling process;

a quadrature modulator for generating a FM modulated high frequency signal by adding together a signal obtained through multiplication of the baseband signal for the equi-phase signal by a local signal of a cosine signal at respective predetermined frequencies, and a signal obtained through multiplication of a sine signal resulting from phase-shifting the local signal through 90 degrees by the baseband signal for the quadrature signal; and said baseband signal processing circuit including:
 (a) an integrator for integrating the modulating signals,
 (b) memory means for pre-storing the sine wave signal of the predetermined frequency,
 (c) an analog-to-digital converter for converting an output signal of the integrator into a digital signal by use of a sampling signal at a predetermined frequency and for reading out the sine wave signal stored in the memory means, and
 (d) a digital-to-analog converter for converting the sine wave signal read out from the memory means into an analog signal, and outputting the baseband signal for the quadrature signal and the baseband signal for the equi-phase signal.

* * * * *